United States Patent
Mysyrowicz et al.

(10) Patent No.: US 8,742,667 B2
(45) Date of Patent: Jun. 3, 2014

(54) METHOD AND SYSTEM FOR INCREASING THE LIFESPAN OF A PLASMA

(75) Inventors: Andre Mysyrowicz, Versailles (FR); Michel Franco, Paris (FR)

(73) Assignees: Ecole Polytechnique, Palaiseau (FR); Ecole Nationale Superieure des Techniques Avancees, Paris (FR); Centre National de la Recherche Scientifique, Paris (FR)

(*) Notice: Subject to any disclaimer, the term of this patent is extended or adjusted under 35 U.S.C. 154(b) by 234 days.

(21) Appl. No.: 13/128,097

(22) PCT Filed: Nov. 6, 2009

(86) PCT No.: PCT/FR2009/052141
§ 371 (c)(1),
(2), (4) Date: Jul. 7, 2011

(87) PCT Pub. No.: WO2010/052435
PCT Pub. Date: May 14, 2010

(65) Prior Publication Data
US 2011/0254448 A1    Oct. 20, 2011

(30) Foreign Application Priority Data
Nov. 7, 2008 (FR) ...................... 08 57608

(51) Int. Cl.
*H05H 1/24*    (2006.01)
*H05H 1/00*    (2006.01)

(52) U.S. Cl.
USPC .................................................. 315/111.21

(58) Field of Classification Search
None
See application file for complete search history.

(56) References Cited

U.S. PATENT DOCUMENTS

| 4,630,274 A | * | 12/1986 | Schafer | .............................. | 372/9 |
| 5,756,924 A | * | 5/1998 | Early | ............................ | 102/201 |
| 7,729,044 B2 | * | 6/2010 | Theberge et al. | ............. | 359/330 |

FOREIGN PATENT DOCUMENTS

FR    2 906 674 A    4/2008

OTHER PUBLICATIONS

Méjean, Guillaume, Improved laser triggering and guiding of meqavolt discharges with dual fs-ns pulses, Appl. Phys. Lett. 88, 021101 (2006).*
Méjean, Guillaume et al., Improved laser triggering and guiding of meqavolt discharges with dual fs-ns pulses, Appl. Phys. Lett. 88, 021101 (2006).*
B. La Fontaine, F. Vidal, D. Comtois, C.-Y. Chien, A. Desparois, T. W. Johnston, J.-C. Kieffer, H. P. Mercure, H. Pépin, and F. A. M. Rizk, IEEE Trans. Plasma Sci. 27, 688, 1999.*
A Couairon, A Mysyrowicz, Femtosecond filamentation in transparent media, Physics Reports Jan. 2007; 441:47-189.*

(Continued)

*Primary Examiner* — Alexander H Taningco
*Assistant Examiner* — Nelson Correa
(74) *Attorney, Agent, or Firm* — Young & Thompson

(57) ABSTRACT

A method and a system for increasing the lifespan of a plasma obtained in the atmosphere. The method includes the following steps: emitting a femtosecond laser pulse, referred to as a first pulse, generating a column of plasma by the filamentation phenomenon, and emitting a second YAG laser pulse, focused by way of an axicon on a line in the plasma column, the energy of the photons of the second laser pulse being greater than the attachment energy of the electrons in the plasma to neutral molecules such as oxygen molecules. The duration of the second pulse is greater than the duration of the first pulse, and the delay between the two pulses is greater than one microsecond.

14 Claims, 1 Drawing Sheet

(56) References Cited

OTHER PUBLICATIONS

Mejean Guillaume et al: "Improved laser triggering and guiding of meqavolt discharges with dual fs-ns pulses" Applied Physics Letters, Jan. 9, 2006, vol. 88, No. 2, pp. 21101-021101, AIP, American Institute of Physics, Melville, NY, US, XP012081583.

Gaul E et al: "Production and characterization of a fully ionized He plasma channel", Applied Physics Letters, Dec. 18, 2000, vol. 77, No. 25, pp. 4112-4114, AIP USA, XP002531503.

Kosareva O G et al: "Formation of extended plasma channels in a condensed medium upon axicon focusing of a femtosecond laser pulse", Nov. 2005, Quantum Electronics Turpion Ltd, vol. 35, No. 11, pp. 1013-1014, Kvantovaya Elektronika UK, XP002531504.

Couairon A et al: "Propagation of twin laser pulses in air and concatenation of plasma strings produced by femtosecond infrared filaments", Optics Communications, ol. 225, No. 1-3, Sep. 15, 2003, pp. 177-192, North-Holland Publishing Co. Amsterdam, NL, XP004454994.

French Search Report, dated Jun. 10, 2009, in Application No. FA 716629/FR 0857608.

International Search Report, Dated Mar. 29, 2010, in PCT/FR2009/052141.

\* cited by examiner

METHOD AND SYSTEM FOR INCREASING THE LIFESPAN OF A PLASMA

The present invention relates to a method and a device that makes it possible to increase the lifespan of a plasma obtained during filamentation of a femtosecond pulse.

The principle of creation of a plasma by filamentation is well known. It involves ionizing the atmosphere by means of an intense laser pulse, thus creating a plasma column, otherwise called a filament.

In general terms, the process of formation of an ionized region of the air greater than the Rayleigh length of the laser beam is usually described in the scientific literature using the term femtosecond filamentation. A high-power laser pulse is capable of ionizing the molecules of the atmosphere. The technology of short-pulsed lasers makes it possible to reach the powers necessary for ionization of the air with quite modest energies per pulse, well below one joule. These lasers have a pulse duration of less than a picosecond, i.e. $10^{-12}$ second and can reach an instantaneous power greater than 10 GW, i.e. $10^7$ Watts.

By way of example, it has already been demonstrated that infrared pulses of a few millijoules of energy, focused in the air by means of a simple lens, are sufficient to create a conducting plasma over lengths of several centimeters around the focus of a lens. The laser pulses originated from a femtosecond laser with titanium-doped sapphire as the active medium. The physical process leading to ionization of the air over a great length is well characterized, and comprises competition between self-focusing of the laser beam and multiphoton ionization involving simultaneous absorption of a large number of infrared photons.

The drawback of a plasma column of this kind is that, for a given pulse, its lifespan is very limited, of the order of a few nanoseconds. In fact, only a fraction of the electrons of the plasma attaches to neutral molecules such as oxygen molecules, the remainder recombining rapidly with the parent ions in less than a nanosecond.

Moreover, the electron density of a plasma of this kind is generally rather low, and its electrical resistance is non-zero, because the majority of the electrons released during the filamentation process recombine with the parent ions in less than a nanosecond.

According to the prior art, systems are known that use a second laser pulse for capturing the electrons that have not yet recombined with the parent ions. Taking into account the great speed with which the majority of the electrons released recombine with the parent ions, this principle therefore requires extreme synchronization, almost instantaneous, between the two laser pulses.

A subject of the present invention is to provide a method and a device making it possible to increase the lifespan of a plasma obtained during filamentation of a femtosecond pulse, without requiring the implementation of extremely precise synchronization between the two laser pulses used.

The present invention also relates to the creation of a long filament of conducting plasma in the atmosphere.

A further aim of the invention is to obtain a plasma column the electron density of which is increased relative to the electron density obtained during simple filamentation.

At least one of the aforementioned aims is achieved with a method for increasing the lifespan of a plasma, preferably obtained in the atmosphere or in other inert gases.

This method comprises the following steps:
emission of a femtosecond laser pulse called the first pulse, generating a plasma column by the phenomenon of filamentation, and
emission of a second laser pulse that is focused on a line in the plasma column, the energy of the photons of this second laser pulse being greater than the attachment energy of the electrons of the plasma to neutral molecules such as oxygen molecules.

In contrast to the system of the prior art, the present invention relates to the electrons that become attached to the neutral molecules, and not only in the electrons that are free for a very short period.

The second laser pulse, of longer duration than the first pulse, will make it possible to achieve increased, or even total, ionization of the medium. In fact, the energy hv of the photons of this second laser pulse is greater than the attachment energy of the electrons to the neutral molecules such as oxygen molecules, so that said photons permit photodetachment of these electrons. The photodetached electrons, accelerated by the intense field of the laser, collide with other neutral molecules, producing a new generation of electrons, which in their turn will collide with other neutral molecules. This is called an avalanche effect. This phenomenon of ionization by impact and avalanche causes the electron population to increase considerably, until there is total ionization of the medium. The initial plasma thus becomes "enriched" with electrons, and then forms an electrical conductor offering lower resistance since the electron population obtained is greater than the initial population. There may thus be obtained, by the phenomenon of dielectric breakdown, a plasma column the electron density of which equals or exceeds the density obtained during filamentation, and the lifespan of which is longer. Typically, the lifespan of the plasma column obtained is three orders of magnitude greater than the lifespan of the initial plasma column.

In the method according to the invention, an axicon is used, in particular a planoconvex converging axicon lens, for focusing the second laser pulse on said line in the plasma column. An axicon is in fact a conical lens, producing a focal line, rather than a focal point, as in the case of simple converging lenses, for example.

According to the invention, the focal line of the axicon coincides with the axis of the plasma column. Thus, with the axicon focusing the luminous energy of the second laser pulse on a focal line, the phenomenon of ionization by impact and avalanche does not occur on a point of the plasma column, but on an entire segment of said column. This is what makes it possible to obtain a plasma column of electron density equal to or greater than the density obtained during filamentation, and of longer lifespan. The focal length of the second laser pulse according to the invention is typically of the order of meters, for example between 50 centimeters and 5 meters. In a preferred embodiment, the second laser pulse is focused on a length equal or roughly equal to the length of the initial plasma.

The cone angle of the axicon according to the invention is between 170° and 180°. In fact, the closer the cone angle is close to 180°, the longer the focal line of the axicon. It is therefore advantageous to use cone angles of the axicon close to 180°, for focusing on a large length, of a few meters for example, but less than 180°, so that the axicon remains converging. A smaller axicon angle can be compensated with higher power of the second laser pulse. In fact, a smaller axicon angle, at fixed power, leads to a shorter focal line. This loss of length can then be compensated with higher power of the second pulse passing through the axicon.

The moment of arrival of the second laser pulse is after that of the first laser pulse. The delay between the two laser pulses in the method according to the invention is between a few microseconds and a few milliseconds, typically between 1 microsecond and 10 milliseconds. This delay is significantly greater than the lifespan of the initial plasma, which is of the order of some nanoseconds, which can be explained by the fact that the neutral molecules involved in the initial filamentation process retain a memory of this filamentation. It can therefore be seen that the method according to the invention offers a fairly long time interval during which it is possible to send the second laser pulse. Therefore it is not necessary to use extremely precise synchronization processes. However, the possible delay for the second pulse may be shortened when the environment is unfavourable, for example in the presence of strong diffusion, wind, etc. This delay also depends on the length of the plasma column the lifespan of which it is desired to increase. The greater the length, the shorter must be the delay between the two laser pulses.

A laser producing pulses of high power, for example between 0.1 and 100 TW, i.e. between $10^{11}$ and $10^{14}$ Watts, is used for producing the first laser pulse. This is then called an intense pulse. It is necessary to have a power greater than the minimum power capable of producing a filament in the air. This is of several GW for pulses with a wavelength of 800 nanometers. By using far higher powers, a beam of parallel filaments is created, which greatly facilitates alignment with the axis of the axicon.

A laser producing ultrashort pulses, for example pulses of duration between 50 and 500 femtoseconds, is used for producing this same first laser pulse.

In an embodiment of the invention, a laser producing pulses with a wavelength of 800 nanometers is used also for producing this same first laser pulse.

A laser producing pulses of duration longer than that of the pulses that were used for forming the plasma column is used for producing the second laser pulse. Typically, a laser is used that produces nanosecond pulses, for example pulses of duration between a few nanoseconds and a few tens of nanoseconds.

A laser producing pulses of energy, for example equal to several hundred millijoules, is used for producing this same second laser pulse. For example, a frequency-doubled YAG laser, producing pulses with a wavelength of 532 nanometers, is used. An advantage of using such a laser is that it is commercially available.

According to another aspect of the invention, a device according to the invention is proposed, for increasing the lifespan of a plasma obtained in the atmosphere or in other inert gases, said device comprising:

a first pulsed laser producing a femtosecond laser pulse called the first pulse, which generates a plasma column by the filamentation phenomenon, and a second laser producing a second laser pulse that is focused on a line in the plasma column, the energy of the photons of this second laser pulse being greater than the attachment energy of the electrons of the plasma to neutral molecules such as oxygen molecules.

Other advantages and characteristics of the invention will become apparent on examination of the detailed description of an embodiment which is in no way limitative, and the attached diagrams, in which.

Figure 1:
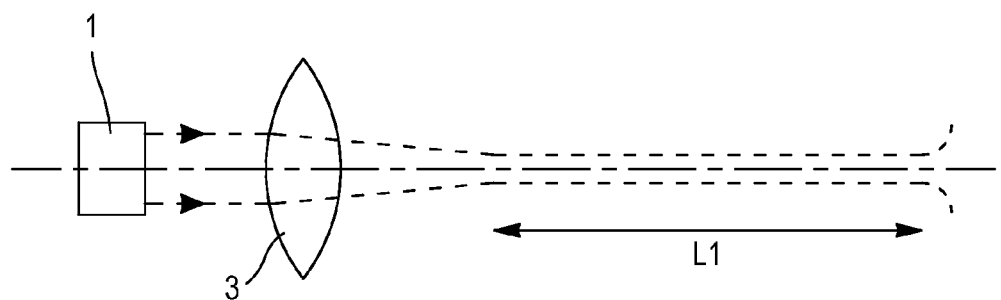
FIG. 1 is a diagrammatic view of a device making it possible to generate the plasma column.
Figure 2:
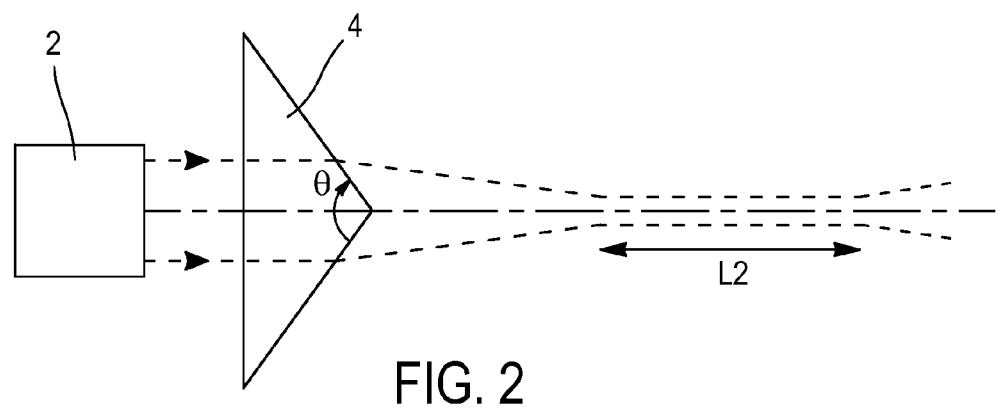
FIG. 2 is a diagrammatic view of a device making it possible to increase the lifespan of said plasma column according to the invention.

The invention will now be described, with reference to FIGS. 1 to 3.

The device according to the invention, for increasing the lifespan of a plasma in the air, comprises:

a first pulsed laser 1 producing a femtosecond laser pulse called the first pulse, which generates a plasma column by the filamentation phenomenon, and a second laser 2 producing a second laser pulse that is focused on a line in the plasma column, the energy of the photons of this second laser pulse being greater than the attachment energy of the electrons of the plasma to neutral molecules.

In a preferred embodiment, the pulsed laser 1 is focused by a converging lens 3 of focal length for example equal to 2 meters. Advantageously, a laser is used producing pulses of some millijoules, for example 15 millijoules, of 50 femtoseconds duration, with a wavelength of 800 nanometers. For example, a Titanium:Sapphire laser is used.

According to a particular embodiment of the invention, the plasma column obtained as a result of the first laser pulse has a length L1 of 1 meter. It has an electron density of the order of $10^{17}$ electrons per cubic centimeter. The majority of these electrons recombines with the ionized molecules, and about $10^{14}$ electrons per cubic centimeter are trapped on neutral molecules such as oxygen molecules. These last-mentioned electrons are weakly bound to the neutral molecules, and can easily be detached from them by means of a second laser. In this stage, this is called filamentation.

The lifespan of the plasma column is short, of the order of a few nanoseconds.

In this same preferred embodiment, the second laser 2 is a Neodymium YAG laser, with energy of 250 millijoules per pulse, with a wavelength of 532 nanometers. The second laser 2 can be called an "enrichment laser". The duration of a pulse is greater than that of the pulse used for forming the plasma column, also called filament, i.e. a few nanoseconds to several tens of nanoseconds. In one embodiment, a pulse duration of the order of ten nanoseconds is used for the second laser 2. The energy per pulse of the second laser 2 is in this embodiment of the order of a joule, more precisely 250 millijoules. The higher the energy per pulse of the second laser, the better the method works. The frequency of the second laser 2, linked to its wavelength, can be in the visible, the near infrared, or the farther infrared, provided that the energy of a photon of a pulse is greater than the attachment energy of the electrons to neutral molecules such as oxygen molecules, i.e. 0.15 eV. The pulse of the second laser 2 will thus permit photodetachment of the electrons of said neutral molecules. Thus, the electrons, released initially, then captured by neutral molecules, are released again, but are also sufficiently accelerated by the intense electric field of the second laser 2 so that they produce new generations of free electrons by an avalanche process. The initial plasma is said to be revitalized.

The second laser 2 is focused by an axicon 4, in particular a planoconvex converging axicon lens. The axicon 4 makes it possible to focus the laser pulse due to the second laser 2 on a significant length that is made to coincide with the plasma column by adjusting the position of the second laser 2.

Figure 3:
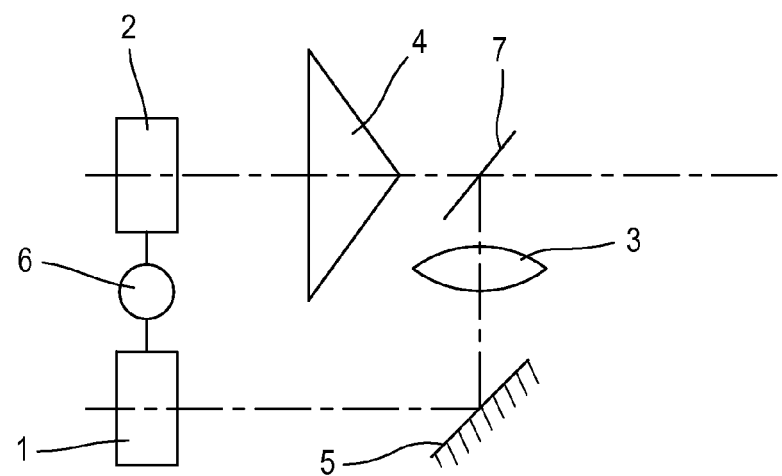
FIG. 3 is a diagrammatic view of a complete device making it possible to generate the plasma column and then to increase its lifespan according to the present invention.

FIG. 3 shows an embodiment in which a mirror 5 is used at 45° placed in the optical path of the first pulse originating from the pulsed laser 1. This mirror 5 reflects the first pulse onto a dichroic mirror 7 via the converging lens 3. This dichroic mirror 7 has the function of superposing the first pulse on the second pulse received from the second laser 2 via the axicon 4. According to this embodiment, the optical path of the second pulse remains linear whereas the optical path of the first laser pulse undergoes two reflections at 45°. In other words, the dichroic mirror 7 is reflective for the second pulse, and is transparent for the first pulse, so that the optical paths taken by the two pulses leaving this dichroic mirror 7 can be superposed. In a preferred embodiment, the cone angle θ of the axicon is equal to 179°. One of the advantages connected with the use of an axicon is that electrons can be released from the neutral molecules, over a length L2 of the order of a few meters, greater than the Rayleigh length. In a preferred embodiment, L1 is equal to L2, i.e. the length on which the pulse emitted by the second laser 2 is focused is equal to the length of the plasma created initially. If a cone angle of less than 179° were to be used for the axicon, it would be necessary to increase the power of the second laser 2 so as to increase the energy per pulse, and thus maintain the same length L2.

Revitalization of the plasma column makes it possible to obtain a plasma column the electron density of which can equal or even exceed the density obtained initially, during filamentation. Moreover, said revitalized plasma column has a much longer lifespan than the initial plasma column.

The moment of arrival of the second laser pulse is after the first pulse, and the delay between these pulses can be controlled between some microseconds and some milliseconds. In FIG. 3, a delay generator 6 is used for controlling the delay between these two pulses. This delay is greater than the lifespan of the plasma created initially, said lifespan being of the order of a few nanoseconds, which is made possible by the fact that the oxygen molecules involved in the filamentation process retain a memory of this filamentation. In a preferred embodiment, a substantial increase of the electron density along the filament axis is obtained for a delay of the order of a millisecond between the two laser pulses. This time difference, or delay, which is acceptable for revitalization of the plasma to take place, may decrease when the conditions are unfavourable, for example in the presence of wind, or phenomena of increased diffusion. This acceptable delay when using an axicon should be compared with the acceptable delay when using a conventional lens. In this case, the delay between the two laser pulses can typically be comprised between 10 and 50 microseconds.

It is thus possible to revitalize, over several meters, an initial plasma of a length up to about a hundred meters, with a radius of the order of 10 micrometers, and with a lifespan of the order of a few nanoseconds. Revitalization makes it possible to obtain a plasma column the lifespan of which is three orders of magnitude greater than the lifespan of the initial plasma, and it is possible to reach life spans of the order of 100 microseconds, for example.

There are numerous applications for such a device and the associated method. In general, this makes it possible to deposit electric discharges at distances, in a particular desired place.

As a non-limitative example, the method and the device according to the present invention make it possible to trigger lightning, by forming a long filament of conducting plasma in the air. The general principle of guiding lightning by an optical method consists of multiplying the electrons until causing a discharge, or dielectric breakdown permitting formation of a long-lasting plasma. To trigger lightning by this kind of optical method, it is necessary to form a long filament of conducting plasma in the air. This possibility is provided by filamentation, during which an ultrashort pulse (for example 50 to 500 femtoseconds), of high power (for example 0.1 to 100 TW, i.e. $10^{11}$ to $10^{14}$ Watts) undergoes self-focusing by the Kerr optical effect until the intensity on the axis has become sufficient to ionize the air by a multiphotoionization effect, i.e. ejection, by a photon, of one or more electrons of an atom, an ion or a molecule. The Kerr optical effect is produced by the electric field of the light ray, and comprises linear variation of the refractive index of the propagating medium with the luminous intensity of the ray being propagated. The advantage of this optical method is that once formed, the ionization defocuses the beam, which leads, through competition between self-focusing and defocusing, to a long plasma column, with a length of several hundred meters. However, the drawback of this optical method according to the prior art is the fact that the lifespan of the plasma created is short, of the order of a few nanoseconds, and that only a fraction of the molecules of the air is ionized, resulting in the creation of a plasma filament the electrical resistance of which is not zero. As already seen, the reason for this short lifespan is that a fraction of the electrons of the plasma attaches to the neutral molecules such as oxygen molecules, the remainder recombining rapidly with the parent ions in less than a nanosecond.

The present invention is remarkable in particular in that it opens up a new era in the development of optical systems for triggering lightning. To do this, firstly, in stormy weather, a region in the sky is sought that is favourable to the triggering of lightning. Then a plasma column is created in the desired place, and is enriched by the method according to the present invention, the electric field of the storm promoting the liberation of electrons.

This plasma column, which is an excellent conductor of electricity, then makes it possible to guide the lightning by clearing a path for the flash of lightning.

Diagrammatically, a cloud that is highly charged with electrons is discharged by establishing, by means of the highly electrically conductive plasma column, electrical connection with the ground, which is electrically neutral. This plasma column, with increased electron density and decreased resistance, also makes it possible to discharge a charged cable, for example for reasons of safety. In fact, a plasma can conduct enormous amounts of current.

Of course, the invention is not limited to the examples which have just been described and numerous adjustments can be made to these examples without exceeding the scope of the invention.

The invention claimed is:
1. Method for increasing the lifespan of a plasma, said method comprising the following steps:
   emission of a femtosecond laser pulse called the first laser pulse, generating a plasma column by a filamentation phenomenon, and
   emission of a second laser pulse that is focused on a line in the plasma column, the energy of the photons of this second laser pulse being greater than the attachment energy of the electrons of the plasma to neutral molecules such as oxygen molecules,
   wherein the delay between the first and second laser pulses is between 1 microsecond and 10 milliseconds.
2. Method according to claim 1, characterized in that an axicon is used for focusing the second laser pulse on said line.
3. Method according to claim 2, characterized in that the focal line of the axicon coincides with the axis of the plasma column.
4. Method according to claim 2, characterized in that the cone angle of the axicon is between 170° and 180°.
5. Method according to claim 1, characterized in that the duration of the second pulse is greater than the duration of the first laser pulse.

6. Method according to claim 1, characterized in that a laser producing pulses of power between 0.1 and 100 TW, i.e. between $10^{11}$ and $10^{14}$ W, is used for producing the first laser pulse.

7. Method according to claim 1, characterized in that a laser producing pulses of duration between 50 and 500 femtoseconds is used for producing the first laser pulse.

8. Method according to claim 1, characterized in that a laser producing pulses with a wavelength of 800 nanometers is used for producing the first laser pulse.

9. Method according to claim 1, characterized in that a laser producing nanosecond pulses is used for producing the second laser pulse.

10. Method according to claim 1, characterized in that a laser producing pulses of energy equal to several hundred millijoules is used for producing the second laser pulse.

11. Method according to claim 1, characterized in that a YAG laser is used for producing the second laser pulse.

12. Method according to claim 1, characterized in that the focal length of the second laser pulse is between 50 centimeters and 5 meters.

13. Method according to claim 1, characterized in that the focal length of the second laser pulse is identical to the length of the plasma column.

14. Device for increasing the lifespan of a plasma obtained in the atmosphere or in other gases, said device comprising:
- a first pulsed laser producing a femtosecond laser pulse called the first laser pulse, which generates a plasma column by the filamentation phenomenon, and
- a second laser producing a second laser pulse that is focused on a line in the plasma column, the energy of the photons of this second laser pulse being greater than the attachment energy of the electrons of the plasma to neutral molecules such as oxygen molecules,
- wherein the delay between the first and second laser pulses is between 1 microsecond and 10 milliseconds.

* * * * *